(12) United States Patent
Wu et al.

(10) Patent No.: US 10,008,174 B2
(45) Date of Patent: Jun. 26, 2018

(54) FAN-OUT CIRCUIT AND DISPLAY DEVICE USING THE SAME

(71) Applicant: Innolux Corporation, Miao-Li County (TW)

(72) Inventors: Ching-Lung Wu, Miao-Li County (TW); Jen-Chih Lu, Miao-Li County (TW); Neng-Hsien Wang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days. days.

(21) Appl. No.: 15/168,288

(22) Filed: May 31, 2016

(65) Prior Publication Data

US 2016/0365062 A1 Dec. 15, 2016

(30) Foreign Application Priority Data

Jun. 10, 2015 (CN) .......................... 2015 1 0315047

(51) Int. Cl.
*G09G 5/00* (2006.01)
*H01L 23/528* (2006.01)

(52) U.S. Cl.
CPC ........... *G09G 5/003* (2013.01); *H01L 23/528* (2013.01); *G09G 2300/0413* (2013.01); *G09G 2330/021* (2013.01)

(58) Field of Classification Search
CPC ............. G09G 5/003; G09G 2330/021; G09G 2300/0413; H01L 23/528
See application file for complete search history.

(56) References Cited

U.S. PATENT DOCUMENTS

| | | | | |
|---|---|---|---|---|
| 7,705,952 B2* | 4/2010 | Lee | ........................ | G02F 1/1345 349/149 |
| 2007/0085963 A1* | 4/2007 | Huang | .................. | G02F 1/1345 349/152 |
| 2010/0156769 A1* | 6/2010 | Chang | .................. | G09G 3/3648 345/87 |
| 2010/0283955 A1* | 11/2010 | Kim | ...................... | G02F 1/1345 349/149 |
| 2011/0075089 A1* | 3/2011 | Jheng | .................... | G02F 1/1345 349/152 |
| 2016/0035307 A1* | 2/2016 | Jeon | ...................... | H01L 27/124 345/211 |

\* cited by examiner

*Primary Examiner* — Kwang-Su Yang
(74) *Attorney, Agent, or Firm* — McClure, Qualey & Rodack, LLP

(57) ABSTRACT

A fan-out circuit including a plurality of first fan-out lines is provided. At least one of the first fan-out lines includes a first upper segment, a first upper connection part having one end connected to the first upper segment, a first intermediate segment having one end connected to the other end of the first upper connection part, a first lower connection part having one end connected to the other end of the first intermediate segment, and a first lower segment connected to the other end of the first lower connection part. At least one of the first upper segment, the first intermediate segment and the first lower segment has a zigzag structure.

5 Claims, 3 Drawing Sheets

FAN-OUT CIRCUIT AND DISPLAY DEVICE USING THE SAME

This application claims the benefit of People's Republic of China application Serial No. 201510315047.1, filed Jun. 10, 2015, the disclosure of which is incorporated by reference herein its entirety.

TECHNICAL FIELD

The disclosure relates in general to a fan-out circuit and a display device using the same.

BACKGROUND

In recent years, as display technology being developed, display panels with various sizes have been widely used in electronic devices, such as smart phones, tablet computers, televisions, and personal computers. In general, the display panel can apply a proper voltage to pixels through scan lines and data lines to display expected image data.

A signal source for controlling the scan lines and the data lines can be disposed in a non-display region of the display panel in a driver integrated circuit. One end of the scan lines or the data lines are gathered toward the drive integrated circuit to form a fan-out circuit.

However, due to the difference between impedance among the wires of the fan-out circuit, if the voltage of the signal transmitted from the driver integrated circuit to a display region does not reach a required level, screen will become abnormal. Besides, deviations will occur in wire width of the fan-out circuit due to manufacturing process. Particularly, thinner portion of the wire is more seriously affected in the manufacturing process. The deviation of the wire width results in difference between actual impedance and ideal impedance of the wire.

Therefore, how to provide a technique capable of reducing the difference between impedance among the wires of the fan-out circuit and increasing the allowed minimum width of the wires has currently become a prominent task for the industries.

SUMMARY

The disclosure is directed to a fan-out circuit and a display device using the same capable of reducing a difference between impedance among wires of the fan-out circuit and increasing the tolerable minimum width of the wires.

According to one embodiment, a fan-out circuit including a plurality of first fan-out lines is provided. At least one of the first fan-out lines includes a first upper segment, a first upper connection part having one end connected to the first upper segment, a first intermediate segment having one end connected to the other end of the first upper connection part, a first lower connection part having one end connected to the other end of the first intermediate segment, and a first lower segment connected to the other end of the first lower connection part. At least one of the first upper segment, the first intermediate segment and the first lower segment has a zigzag structure.

According to another embodiment, a display device including a driver, a display circuit and a fan-out circuit is provided. The driver provides a driving signal. The display circuit drives a plurality of pixels through a plurality of signal lines in response to the driving signal. The fan-out circuit is coupled between the driver and the display circuit, and includes a plurality of first fan-out lines. At least one of the first fan-out lines includes a first upper segment having one end coupled to the driver to receive the driving signal, a first upper connection part having one end connected to the other end of the first upper segment, a first intermediate segment having one end connected to the other end of the first upper connection part, a first lower connection part having one end connected to the other end of the first intermediate segment, an a first lower segment having one end connected to the other end of the first lower connection part and the other end is coupled to one of the plurality of signal lines to transmit the driving signal to the signal lines. At least one of the first upper segment, the first intermediate segment and the first lower segment has a zigzag structure.

The above and other aspects of the invention will become better understood with regard to the following detailed description of the preferred but non-limiting embodiment(s). The following description is made with reference to the accompanying drawings.

Figure 1:
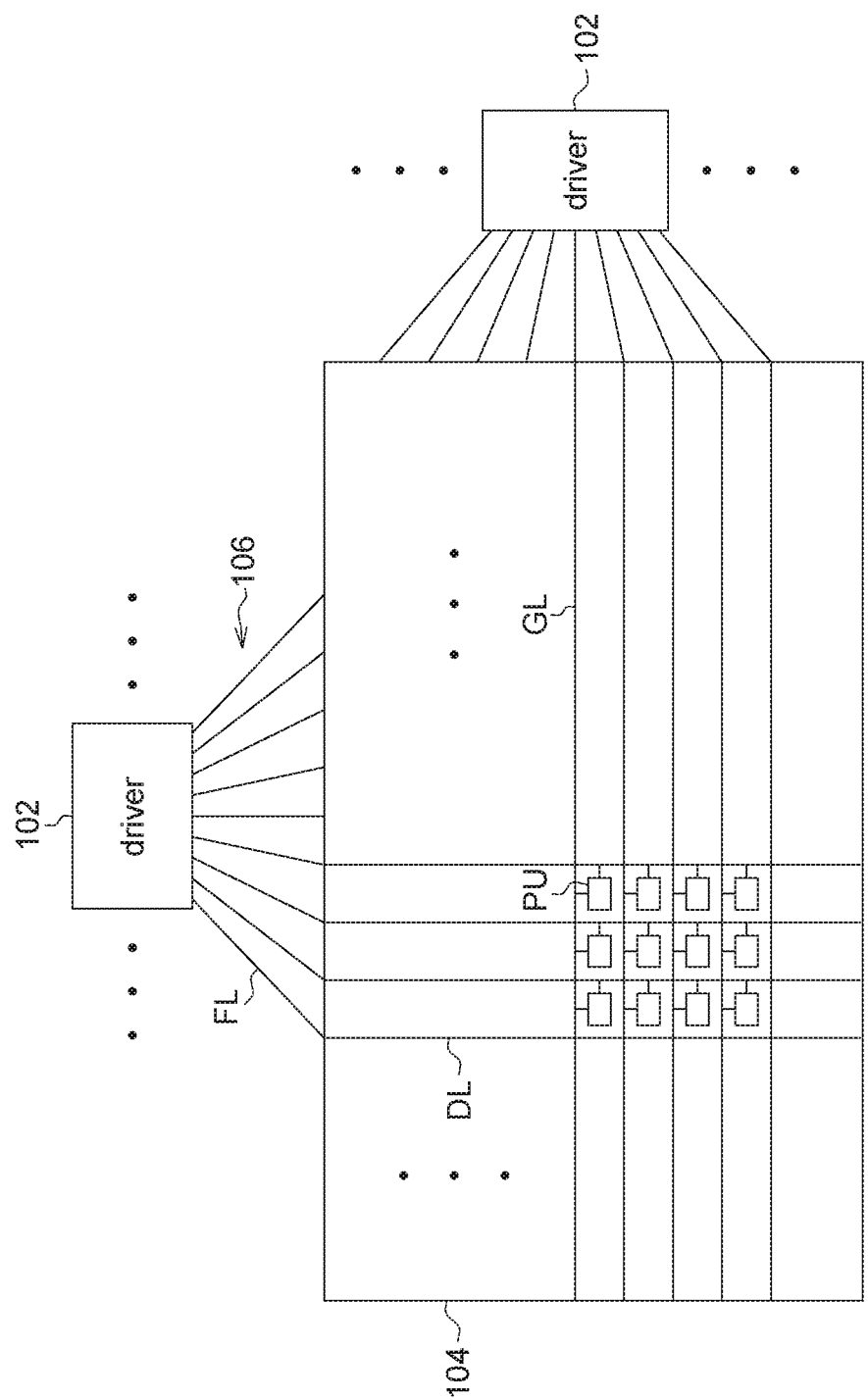
FIG. 1 shows a schematic diagram of a display device according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A number of embodiments are disclosed below for elaborating the invention. However, the embodiments of the invention are for detailed descriptions only, not for limiting the scope of protection of the invention. Furthermore, secondary or unimportant elements are omitted in the accompanying diagrams of the embodiments for highlighting the technical features of the invention.

FIG. 1 shows a schematic diagram of a display device 10 according to an embodiment of the present invention. The display device 10 includes a driver 102, a display circuit 104 and a fan-out circuit 106. The display device 10 can be realized by various types of displays or any electronic devices equipped with a display screen.

The driver 102, such as a display drive chip, provides a driving signal. The type of the driver 102 and the kind of the driving signal outputted by the driver 102 can be designed according to the configuration of the circuit. For instance, the driver 102 can be disposed on one side of the display circuit 104 and electrically connected to a plurality of data lines DL through the fan-out circuit 106 to provide a proper pixel voltage to pixels PU of the display circuit 104. Alternatively, the driver 102 can be disposed on the other side of the display circuit 104 and electrically connected to a plurality of gate lines GL through the fan-out circuit 106 to provide a gate signal to enable/disenable pixel row. The driver 102 can also be electrically connected to the plurality of gate lines GL and the plurality of data lines DL through the fan-out circuit 106 at the same time (not illustrated), and such design is still within the scope of protection of the present invention.

The display circuit 104 drives a plurality of pixels PU through a plurality of signal lines in response to the driving signal. As shown in FIG. 1, the signal lines include the data lines DL and the gate lines GL. An electrical voltage of the driving signal transmitted in the data lines DL, such as the pixel voltage, corresponds to a target gray scale display. The driving signal transmitted in the gate lines GL is the gate signal for instance. When the gate signal in a certain gate line GL is in an enabled state (for example, the gate signal has a high level voltage), a pixel transistor connected to the gate line GL will be turned on, such that the pixel row of the gate line GL can receive the pixel voltage from the data lines DL. On the other hand, when the gate signal is in a disenabled state (for example, the gate signal has a low level voltage), the pixel transistor connected to the gate line GL will be turned off, such that the pixel row of the gate line GL cannot receive the pixel voltage from the data lines DL.

The fan-out circuit 106 is coupled between the driver 102 and the display circuit 104. The fan-out circuit 106 includes a plurality of fan-out lines FL for connecting the signal lines of the display circuit 104 (such as the data lines and the gate lines) to signal links of the driver 102. The signal links of the driver 102 can be designed according to the packaging technique of a chip used in the present invention. For instance, if the driver 102 is packaged by the chip on film (COF) technology, the signal links are signal pins extended on the film; if the driver 102 is packaged by the chip on glass (COG) technology, the signal links of the driver 102 are signal pins of the chip.

In general, pitches between the signal links of the driver 102 are smaller than pitches between the signal lines arranged in the display circuit. Therefore, in order to guide the signal lines to the signal links of the driver 102, one end of the signal lines needs to be centralized towards the position of the driver 102, hence forming the fan-out circuit 106 as shown in FIG. 1.

It can be understood that the display device of the present invention is not limited to the embodiment in FIG. 1. For example, the driver can be disposed at any position in a non-display region of the display device. Furthermore, the arrangement and quantity of the driver and the fan-out circuit are determined according to product specifications (such as panel size and chip variety). Besides, the said signal lines are not limited to the gate lines or the data lines, and can be realized by any lines disposed in the display circuit and capable of receiving signals from the driver. For example, the signal lines can be realized by such as clock lines or control lines.

Figure 2:
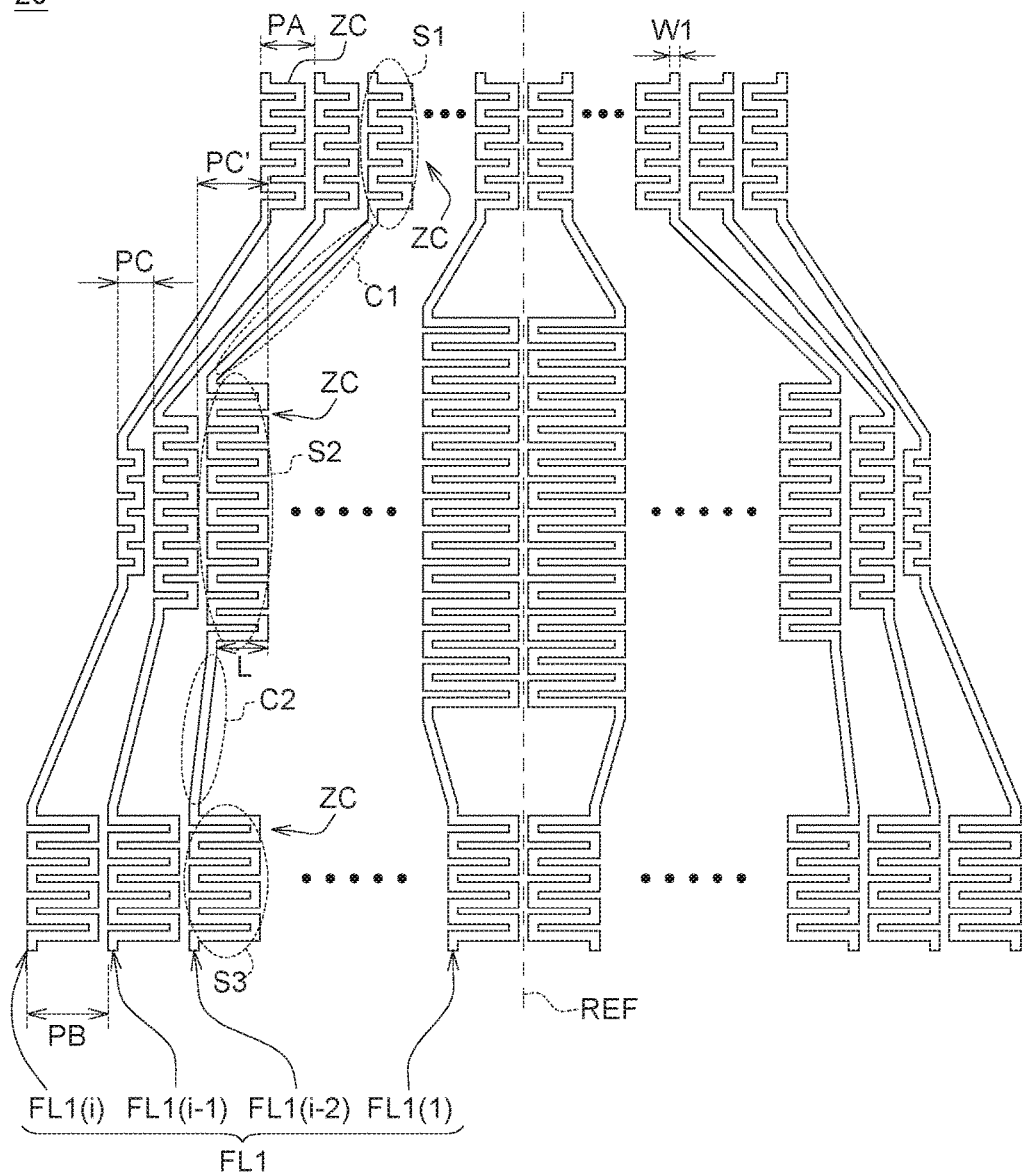
FIG. 2 shows a schematic diagram of a portion of a fan-out circuit according to an embodiment of the present invention.

FIG. 2 shows a schematic diagram of a portion of a fan-out circuit 20 according to an embodiment of the present invention. The fan-out circuit 20 includes a plurality of first fan-out lines FL1. Each first fan-out line FL1 includes a first upper segment S1, a first upper connection part C1, a first intermediate segment S2, a first lower connection part C2 and a first lower segment S3. One end of the first upper segment S1 of the first fan-out lines FL1 is connected to the signal links of the driver for instance. One end of the first lower segment S3 of the first fan-out lines FL1 is connected to the signal lines of the display circuit. In other words, a pitch PA between the first upper segments S1 of any two neighboring first fan-out lines FL1 is determined according to chip pins of the driver, and a pitch PB between the first lower segments S3 of any two neighboring first fan-out lines FL1 is determined according to a pitch of the signal lines. The pitch PA between the first upper segments S1 is, for example, smaller than the pitch PB. Moreover, values of the pitch PA and the pitch PB can be constant values or variables, and are not subject to specific restrictions.

The first upper segment S1, the first upper connection part C1, the first intermediate segment S2, the first lower connection part C2 and the first lower segment S3 are sequentially connected to form an integrated circuit pattern. As indicated in FIG. 2, one end of the first upper connection part C1 is connected to the first upper segment S1, one end of the first intermediate segment S2 is connected to the other end of the first upper connection part C1, one end of the first lower connection part C2 is connected to the other end of the first intermediate segment S2, and a first lower segment S3 is connected to the other end of the first lower connection part C2. Extend angles as well as lengths of the first upper connection part C1 and the second upper connection part C2 can be varied according to an impedance design of different circuit configurations.

At least one of the first upper segment S1, the first intermediate segment S2 and the first lower segment S3 has a zigzag structure ZC. The zigzag structure ZC can increase an equivalent impedance of the segment. Therefore, the equivalent impedance of the first fan-out lines FL1 can be adjusted through the adjustment of relevant parameters such as zigzag margin L, zigzag number and zigzag pitch of the zigzag structure of the segments S1, S2, S3, such that the difference between impedance among the first fan-out lines FL1 and other fan-out lines can be reduced or eliminated or can form a proportional relationship.

In an embodiment, the zigzag margin L and the zigzag number of the zigzag structure of the first intermediate segment S2 of at least one of the first fan-out lines FL1 are determined according to the impedance of the first upper segment S1 and the impedance of the first lower segment S3. For instance, if a first fan-out line FL1 with a specific width does not reach the required impedance even though the first upper segment S1 and the first lower segment S3 already use a densest zigzag structure, the first fan-out line FL1 still can reach the required impedance through adjustment of the zigzag structure of the first intermediate segment S2. Therefore, instead of having a fixed pitch PA between two neighboring first upper segment S1 and a fixed pitch PB between two neighboring first lower segment S3, at least one set of pitches between two neighboring first intermediate segments S2 of the first fan-out lines FL1 is not equivalent. In other words, at least two neighboring first fan-out lines FL1 have different pitches at the first intermediate segments S2 due to the difference in the zigzag margin L. As indicated in FIG. 2, the pitch between the first intermediate segment S2 of the i-th first fan-out line FL1(i) and the (i-1)-th first fan-out line FL1(i-1) is PC, the pitch between the first intermediate segment S2 of the (i-1)-th first fan-out line FL1(i-1) and the (i-2)-th first fan-out line FL1(i-2) is PC', and the pitch PC is not equal to the pitch PC'.

In the embodiment shown in FIG. 2, the first fan-out lines FL1 can be arranged on both sides of a dummy reference line REF in a symmetrical manner or a asymmetrical manner. The zigzag margin L of the zigzag structure of the first intermediate segment S2 of each first fan-out line FL1 progressively decreases towards the both sides from the dummy reference line REF. This is because the length of the first fan-out line FL1 progressively increases towards the both sides from the dummy reference line REF, and for the first fan-out line FL1 farthest away from the dummy reference line REF, the first intermediate segment S2 can reach the required impedance even though the zigzag margin of the zigzag structure is smaller, and the vice versa. However, the present invention is not limited thereto. In other embodiments, based on the structural design of the segment and the connection part of at least one of the first fan-out lines FL1, the zigzag margin of the zigzag structure of the first intermediate segment S2 of at least one of the first fan-out lines FL1 can change irregularly, can progressively increase towards the both sides from the dummy reference line REF, or can remain the same.

Since the impedance of at least one of the first fan-out lines FL1 can be increased through the zigzag structure of the first intermediate segment S2, the requirement of a width W1 of at least one of the first fan-out lines FL1 can be reduced. For example, if the impedance of the first upper segment S1 and the impedance of the first lower segment S3 are already increased to a possible maximum value through the adjustment of the zigzag structure, the width of the first fan-out lines FL1 still needs to be reduced to a first width to reach the target impedance. Meanwhile, if the zigzag structure of the first intermediate segment S2 is adjusted to increase the impedance, the first fan-out line FL1 only needs to be reduced to a second width to reach the target impedance, wherein the second width is larger than the first width. Therefore, by adding the first intermediate segment S2 with the zigzag structure to at least one of the first fan-out lines FL1, the overall minimum width of the fan-out circuit can be effectively increased, and the influence of manufacturing deviations on the impedance of the fan-out lines will decrease. That is, if the width of the fan-out circuit is too small, the influence of manufacturing deviations on the fan-out circuit will increase, making it more difficult to control the impedance of the wire. For example, a deviation of ±1 µm results in an error of 33% when the width is 3 µm and an error of 25% when the width is 4 µm. The impedance variation of the 4 µm wire is smaller which is easier to meet the initial design requirements.

Figure 3:
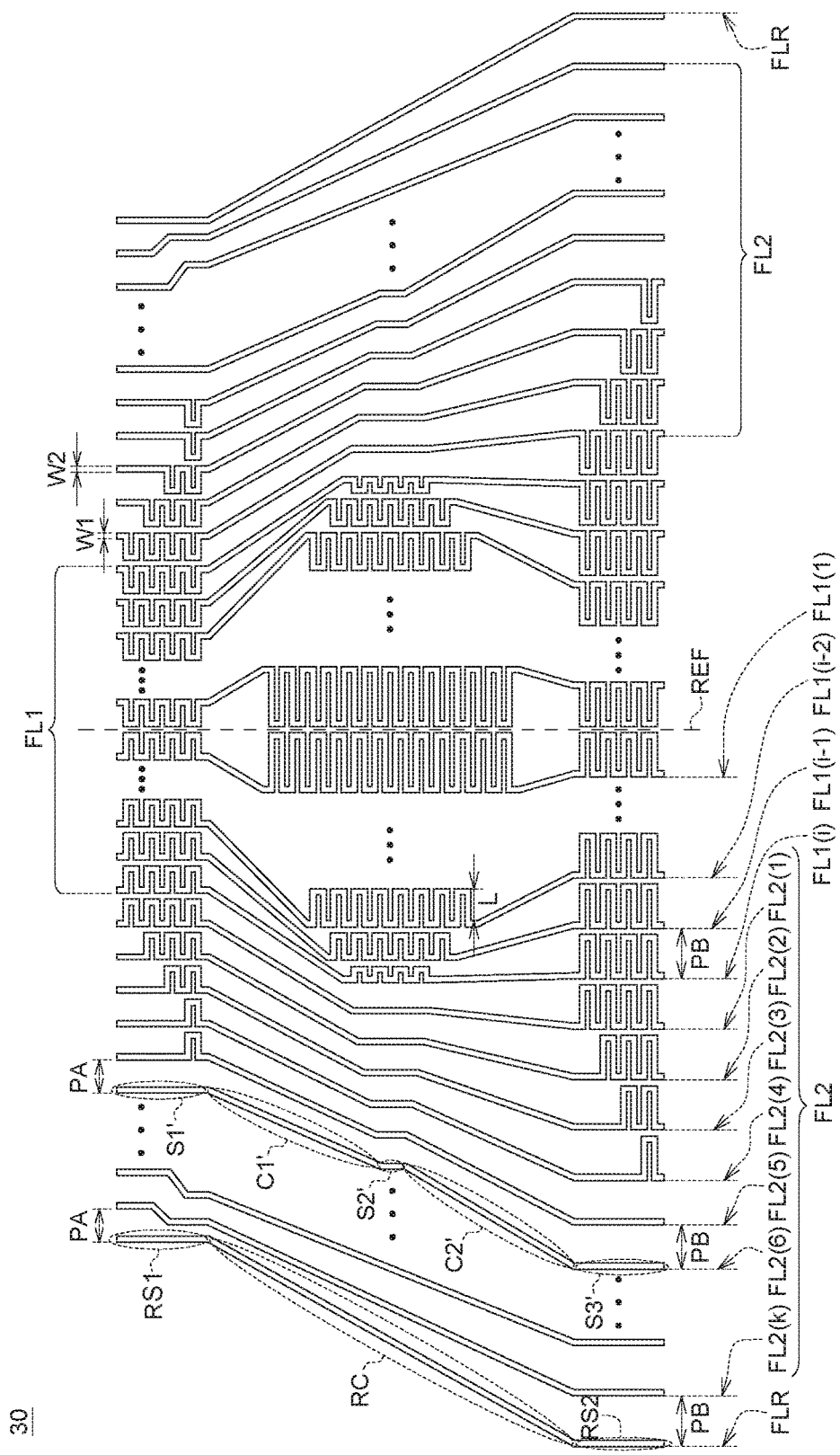
FIG. 3 shows a schematic diagram of a fan-out circuit according to an embodiment of the present invention.

FIG. 3 shows a schematic diagram of a fan-out circuit 30 according to an embodiment of the present invention. The fan-out circuit 30 includes the plurality of first fan-out lines FL1, a plurality of second fan-out lines FL2 and a plurality of reference fan-out lines FLR. As indicated in FIG. 3, the first fan-out lines FL1, the second fan-out lines FL2 and the reference fan-out lines FLR can be arranged on the both sides of the dummy reference line REF in a symmetrical manner or an asymmetrical manner, and in a sequence of the first fan-out lines FL1, the second fan-out lines FL2 and the reference fan-out lines FLR outwards from the dummy reference line REF.

Each second fan-out line FL2 includes a second upper segment S1', a second upper connection part C1', a second intermediate segment S2', a second lower connection part C2' and a second lower segment S3'. One end of the second upper segment S1' of each second fan-out line FL2 is connected to the signal link of the driver for instance, and the pitch between the second upper segments S1' of any two neighboring second fan-out lines FL2 is still PA. One end of the second lower segment S3' of each second fan-out line FL2 is connected to the signal line of the display circuit for instance, and the pitch between the second lower segments S3' of any two neighboring second fan-out lines FL2 is still PB. In other embodiment, the pitch between the second upper segments S1' of any two neighboring second fan-out lines FL2 is not necessary equivalent to a fixed value PA, and may be equivalent to different values. Similarly, the pitch between the second lower segments S3' of any two neighboring second fan-out lines FL2 is not necessary equivalent to a fixed value PB, and may be equivalent to different values.

The second upper segment S1', the second upper connection part C1', the second intermediate segment S2', the second lower connection part C2' and the second lower segment S3' of at least one of the second fan-out lines FL2 are sequentially connected to form an integrated circuit pattern. That is, backbone of the wire of the second fan-out line FL2 is similar to that of the first fan-out line FL1 (regardless of the zigzag structure). As indicated in FIG. 3, one end of the second upper connection part C1' is connected to the second upper segment S1', one end of the second intermediate segment S2' is connected to the other end of the second upper connection part C1', one end of the second lower connection part C2' is connected to the other end of the second intermediate segment S2', and the second lower segment S3 is connected to the other end of the second lower connection part C2'.

Under normal circumstances, the basic wire length of the second fan-out lines FL2 progressively decreases from outside towards the dummy reference line REF. Meanwhile, a zigzag structure can be added to the second upper segments S1' and the second upper connection part S2' or the second lower segment S3' of at least one of the second fan-out lines FL2 to increase the impedance. As indicated in the fan-out circuit 30 of FIG. 3, since location of the second fan-out lines FL2 are farther away from the dummy reference line REF than location of the first fan-out lines FL1, the basic wire lengths of the second fan-out lines FL2 are larger than the basic wire lengths of the first fan-out lines FL1. Some of the second fan-out lines FL2 (such as the second fan-out lines FL2(6)~FL2(k)) can reach the required impedance without adding a zigzag structure ZC to the second upper segment S1', the second intermediate segment S2' and the second lower segment S3'. In other embodiments, some of the second fan-out lines FL2 (such as the second fan-out lines FL2(1)~FL2(5)) can reach the required impedance by adding the zigzag structure ZC to at least one of the second upper segment S1' and the second lower segment S3'. In the embodiment shown in FIG. 3, the second intermediate segment S2' of at least one of the second fan-out lines FL2 is bar-shaped without the zigzag structure ZC.

In an embodiment, width can be varied in the second fan-out lines FL2 to adjust the impedance. Furthermore, since the width and the impedance of a conducting wire form a relationship under the same conditions: the narrower the wire is, the higher the impedance will be. Therefore, the impedance of at least one of the fan-out lines can be increased according to the said relationship. For instance, widths W2 of at least one of the second fan-out lines FL2 can progressively decrease to a minimum width towards the dummy reference line REF. The minimum width is the smallest width among all widths of the fan-out lines. As indicated in FIG. 3, since the second fan-out line FL2(1) is closer to the dummy reference line REF at the center than any other second fan-out lines FL2(2)~FL2(k), the width W2 of the second fan-out line FL2(1) can be set as the minimum width. Meanwhile, suppose the densest zigzag structure ZC is already added to both the second upper segment S1' and the second lower segment S3' of the second fan-out line FL2(1), the increase in the impedance of the fan-out line can be achieved by adding the zigzag structure ZC to the intermediate segment of the fan-out lines as indicated in the first fan-out line FL1(i). In other words, the one of the second fan-out lines FL2 with the minimum width (such as the second fan-out line FL2(1)) is adjacent to the one of the first fan-out lines FL1 farthest away from the dummy reference line (such as the first fan-out line FL1(*i*)). In another embodiment, width of the second fan-out line FL2(1) is closer to the minimum width than any other second fan-out lines FL2. Suppose the impedance needs to be further increased. In an embodiment, the widths W1 of all first fan-out lines FL1 are the minimum width. In another embodiment, the widths W2 of at least one of the second fan-out lines FL2 progressively decrease towards the dummy reference line REF but do not decrease to the minimum width. The widths W1 of at least one of the first fan-out lines FL1 progressively decrease to a minimum width towards the dummy reference line REF.

It can be understood that the present invention is not limited to the above exemplifications. The width of at least one of the first fan-out lines FL1 and at least one of the second fan-out lines FL2 can also change regularly or irregularly, and are determined according to actual needs. Besides, the widths W1 of the first fan-out lines FL1 can also be partly equivalent to the minimum width or not equivalent to the minimum width. In an embodiment, the arrangement of the fan-out lines disposed on both sides from the dummy reference line REF does not need to be in a manner that the second fan-out lines FL2 are not arranged until all the first fan-out lines FL1 have been arranged. The first fan-out lines FL1 and the second fan-out lines FL2 can also be in a staggered arrangement.

Refer to FIG. 3. Each reference fan-out line FLR includes an upper segment RS1, a connection part RC and a lower segment RS2. The reference fan-out lines FLR can be arranged, for example, on the two outmost sides of the fan-out circuit 30. One end of the upper segment RS1 of the reference fan-out lines FLR is connected to the signal links of the driver for instance, and the pitch between the upper segment RS1 of the reference fan-out line FLR and the adjacent second upper segment S1' of the second fan-out line FL2(*k*) is equivalent to the pitch PA. One end of the lower segment RS2 of the reference fan-out line FLR is connected to the signal lines of the display circuit for instance, and the pitch between the lower segment RS2 of the reference fan-out line FLR and the adjacent second lower segment S3' of the second fan-out line FL2(*k*) is equivalent to the pitch PB. In other embodiment, the pitch between the upper segment RS1 of the reference fan-out line FLR and the adjacent second upper segment S1' of the second fan-out line FL2(*k*) is not necessary equivalent to the pitch PA, and the pitch can also be other values. Similarly, the pitch between the lower segment RS2 of the reference fan-out line FLR and the adjacent second lower segment S3' of the second fan-out line FL2(*k*) is not necessary equivalent to the pitch PB, and the pitch can also be other values.

The upper segment RS1, the connection part RC and the lower segment RS2 of the reference fan-out lines FLR are sequentially connected to form an integrated circuit pattern. As indicated in FIG. 3, one end of the connection part RC of the reference fan-out lines FLR is connected to one end of the upper segment RS1, and the lower segment RS2 is connected to the other end of the connection part RC. In the present embodiment, backbone of the wire of the reference fan-out line FLR is not the same as backbone of the wire of the first fan-out lines FL1 or the second fan-out lines FL2. That is, the reference fan-out line FLR does not have an intermediate segment (such as the first intermediate segment S2 of the first fan-out lines FL1 or the second intermediate segment S2' of the second fan-out lines FL1).

In an embodiment, the impedance of the reference fan-out line FLR can be used as reference impedance for other fan-out lines. For instance, after the impedance of the reference fan-out lines FLR is determined, the structure parameters of at least one of the second fan-out lines FL2 can be adjusted such that the impedance of at least one of the second fan-out lines FL2 and the impedance of at least one of the reference fan-out lines FLR can be close or identical to each other or form a proportional relationship. Then, the first fan-out lines FL1 can be added, and the structure parameters of at least one of the first fan-out lines FL1 can be adjusted such that the impedance of at least one of the first fan-out lines FL1 and the impedance of at least one of the reference fan-out lines FLR can be close or identical to each other or form a proportional relationship. The impedance of the reference fan-out lines FLR can be determined according to different circuit applications, and can be obtained through various existing methods for calculating the circuit impedance. It can be understood that the impedance of the fan-out circuit of the present invention is not limited to the above exemplifications. In an embodiment, the impedance of one or more fan-out lines can be used as reference impedance, the structure parameters of other fan-out lines can be adjusted according to the impedance of one or more fan-out lines to reach the expected impedance. In another embodiment, the structure parameters of at least one of the fan-out lines can be directly adjusted to reach the expected impedance.

In summary, the fan-out circuit of the present invention relates to the fan-out lines with a three-segment structure. A zigzag structure can be added to the intermediate segment of the fan-out lines to further increase the impedance of the wire, such that the overall minimum width of the fan-out lines can be increased to decrease the influence of manufacturing deviation on the impedance of the fan-out lines. Besides, the fan-out lines with the three-segment structure increase the flexibility in impedance design, such that the difference between impedance among the wires can be reduced or eliminated.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A fan-out circuit, comprising:
   a plurality of first fan-out lines, at least one of the first fan-out lines comprising:
   a first upper segment;
   a first upper connection part having one end connected to the first upper segment;
   a first intermediate segment having one end connected to the other end of the first upper connection part;
   a first lower connection part having one end connected to the other end of the first intermediate segment; and
   a first lower segment connected to the other end of the first lower connection part;
   a plurality of second fan-out lines, at least one of the second fan-out lines comprising:
   a second upper segment;
   a second upper connection part having one end connected to the second upper segment;
   a second intermediate segment connected to the other end of the second upper connection part;
   a second lower connection part having one end connected to the other end of the second intermediate segment; and a second lower segment connected to the other end of the second lower connection part;
a plurality of reference fan-out lines, at least one of the reference fan-out lines comprising:
an upper segment;
a connection part having one end connected to one end of the upper segment; and
a lower segment connected to the other end of the connection part,
wherein at least one of the first upper segment, the first intermediate segment and the first lower segment has a zigzag structure,
wherein the second intermediate segment is bar-shaped and does not have the zigzag structure,
wherein the plurality of first fan-out lines, the plurality of second fan-out lines and the plurality of reference fan-out lines are arranged on both sides of a dummy reference line in a sequence of the plurality of first fan-out lines, the plurality of second fan-out lines and the plurality of reference fan-out lines outwards from the dummy reference line,
wherein the width of the plurality of second fan-out lines progressively decreases to a minimum width towards the dummy reference line,
wherein the width of the plurality of first fan-out lines is equivalent to the minimum width, and
wherein at least one set of pitches between the first intermediate segments of two neighboring first fan-out lines is not equivalent.

2. The fan-out circuit according to claim 1, wherein at least one of the second upper segment and the second lower segment has a zigzag structure.

3. The fan-out circuit according to claim 1, wherein a line of the plurality of second fan-out lines with the minimum width is adjacent to a line of the first fan-out lines farthest away from the dummy reference line.

4. The fan-out circuit according to claim 1, wherein the plurality of first fan-out lines are arranged on both sides of the dummy reference line, and the zigzag margin of the zigzag structure of the first intermediate segment of at least one of the first fan-out lines progressively decreases from the dummy reference line towards both sides.

5. A display device, comprising:
a driver providing a driving signal;
a display circuit driving a plurality of pixels through a plurality of signal lines in response to the driving signal; and
a fan-out circuit coupled between the driver and the display circuit, wherein the fan-out circuit comprises:
a plurality of first fan-out lines, at least one of the first fan-out lines comprising:
a first upper segment having one end coupled to the driver to receive the driving signal;
a first upper connection part having one end connected to the other end of the first upper segment;
a first intermediate segment having one end connected to the other end of the first upper connection part;
a first lower connection part having one end connected to the other end of the first intermediate segment; and
a first lower segment having one end connected to the other end of the first lower connection part, and the other end of the first lower segment is coupled to one of the plurality of signal lines to transmit the driving signal to the plurality of signal lines;
a plurality of second fan-out lines, at least one of the second fan-out lines comprising:
a second upper segment;
a second upper connection part having one end connected to the second upper segment;
a second intermediate segment connected to the other end of the second upper connection part;
a second lower connection part having one end connected to the other end of the second intermediate segment; and
a second lower segment connected to the other end of the second lower connection part;
a plurality of reference fan-out lines, at least one of the reference fan-out lines comprising:
an upper segment;
a connection part having one end connected to one end of the upper segment; and
a lower segment connected to the other end of the connection part,
wherein at least one of the first upper segment, the first intermediate segment and the first lower segment has a zigzag structure,
wherein the second intermediate segment is bar-shaped and does not have the zigzag structure,
wherein the plurality of first fan-out lines, the plurality of second fan-out lines and the plurality of reference fan-out lines are arranged on both sides of a dummy reference line in a sequence of the plurality of first fan-out lines, the plurality of second fan-out lines and the plurality of reference fan-out lines outwards from the dummy reference line,
wherein the width of the plurality of second fan-out lines progressively decreases to a minimum width towards the dummy reference line,
wherein the width of the plurality of first fan-out lines is equivalent to the minimum width, and
wherein at least one set of pitches between the first intermediate segments of two neighboring first fan-out lines is not equivalent.

* * * * *